United States Patent [19]

Nakamura

[11] Patent Number: 5,202,273

[45] Date of Patent: Apr. 13, 1993

[54] METHOD OF MANUFACTURING A VERTICAL SEMICONDUCTOR DEVICE

[75] Inventor: Shunji Nakamura, Yokohama, Japan

[73] Assignee: Fujitsu Limited, Kawasaki, Japan

[21] Appl. No.: 729,239

[22] Filed: Jul. 12, 1991

[30] Foreign Application Priority Data

Jul. 12, 1990 [JP] Japan .................................. 2-186203

[51] Int. Cl.⁵ .......................................... H01L 21/86
[52] U.S. Cl. ......................................... 437/40; 437/21; 437/50; 148/DIG. 150
[58] Field of Search ...................... 437/50, 21, 938, 40; 148/DIG. 150

[56] References Cited

FOREIGN PATENT DOCUMENTS 1-151263  6/1989  Japan .
1-151264  6/1989  Japan .

Primary Examiner—Olik Chaudhuri
Assistant Examiner—Long Pham
Attorney, Agent, or Firm—Staas & Halsey

[57] ABSTRACT

A semiconductor device comprises a first electrode buried in one main face of a substrate and surrounded by a first insulator, a field oxide film covering the surface of the first electrode, a semiconductor layer connected with the first electrode, a second insulator covering the surface of the semiconductor layer, a second electrode connected with the semiconductor layer, a gate electrode connected with the semiconductor layer between the second insulator and the field oxide film, and an outgoing electrode connected with the first electrode.

12 Claims, 9 Drawing Sheets

DRIFTING SPEED OF SiC ELECTRONS

METHOD OF MANUFACTURING A VERTICAL SEMICONDUCTOR DEVICE

BACKGROUND OF THE INVENTION

1. Field of the Invention

The present invention relates to semiconductor devices and a method of manufacturing the same, and particularly, to high-speed vertical MOS transistors, SITs and 3-terminal superconducting transistors, and methods of manufacturing same.

2. Description of the Related Art

As the demand for high-speed information processing increases, high-speed integrated circuits and transistors for constituting such circuits are needed. This inventor proposed such high-speed semiconductor integrated circuits in Japanese Unexamined Patent Publication Nos. 1-151263 and 1-151264.

FIG. 1 shows one of the high-speed semiconductor devices proposed by the inventor. This semiconductor device involves a static induction transistor (SIT), i.e., a vertical-type (with active carriers flowing orthogonally to a substrate) JFET (junction field effect transistor).

In FIG. 1, numeral 21 denotes a p-type silicon p-Si) semiconductor substrate, 22 a high-concentration n-type (n+-type) drain region, 23 a silicon dioxide (SiO$_2$) field insulation film, 24 an n-type silicon (n-Si) semiconductor layer, the periphery of which in contact with a gate electrode is p-type, 25 an SiO$_2$ interlayer insulation film, 26 a gate electrode, 27 a source electrode, and 28 a drain electrode.

The gate length of this transistor can be precisely defined by controlling the thickness of the semiconductor layer 24, and therefore, it is possible to minimize a parasitic capacitance of the gate and improve the speed of the transistor.

This transistor, however, has the following problems if a further improvement of the operation speed is required:

(1) A junction capacitance between the drain region 22 and the semiconductor substrate 21 hinders the high-speed operation. It is preferable, therefore, to provide an SOI (silicon on insulator) structure with an insulator substrate.

(2) When forming the field SiO$_2$ film 23 on the silicon substrate, the SiO$_2$ film swells as shown in FIG. 2 and prevents the formation of a gate opening, thereby preventing a normal operation of the transistor. Namely, in FIG. 2, when the field SiO$_2$ film 23 is formed with an oxidation-resistant silicon-nitride (Si$_3$N$_4$) insulation film as a mask, an SiO$_2$ projection 23A is formed between the field SiO$_2$ film 23 and the semiconductor layer 24. This projection 23A causes the hindrance mentioned above.

(3) To improve the operation speed, the drain region 22 must have as low a resistance as possible. It is preferable, therefore, to form the drain region 22 with metal. This cannot be realized according to the conventional technique.

The structure of FIG. 1 is not applicable for a 3-terminal superconducting transistor, because not only the source electrode but also the semiconductor substrate itself serving as a drain electrode, of the superconducting transistor, must be made of superconducting materials, and the conventional technique is unable to realize this.

SUMMARY OF THE INVENTION

To solve these problems, an object of the invention is to provide a high-speed vertical semiconductor device and a method of manufacturing the same.

To accomplish this object, the invention provides a semiconductor device basically comprising a first electrode buried in one main face of a substrate and surrounded by a first insulator, a field oxide film covering the surface of the first electrode, a semiconductor layer connected with the first electrode through an opening formed through the field oxide film, a second insulator covering the surface of the semiconductor layer, a second electrode connected with the semiconductor layer through an opening formed through the second insulator, a gate electrode connected with the semiconductor layer between the second insulator and the field oxide film, and an outgoing electrode connected with the first electrode through another opening formed through the field oxide film.

According to the invention, this semiconductor device is fabricated by:

a first process of forming, on a temporary substrate, a semiconductor layer of first conduction type having a smaller etching rate than that of the temporary substrate under the same etching condition, and a first insulation film, and opening a contact hole on the first insulation film to expose the semiconductor layer;

a second process of forming a first electrode on the first insulation film over the contact hole such that the first electrode connects with the semiconductor layer;

a third process of indirectly adhering a reinforcing material to the temporary substrate through an insulator, or directly adhering a reinforcing insulation material to the temporary substrate, and etching and removing the temporary substrate with use of the reinforcing material as a support substrate;

a fourth process of forming a protruding pattern of the semiconductor layer and a second insulation film laminated one upon another on the support substrate, and forming a gate insulation film on the side face of the semiconductor layer; and a fifth process of forming a gate electrode on the side face of the semiconductor layer, opening the second insulation film and forming a second electrode on the semiconductor layer, and opening the first insulation film and forming an outgoing electrode on the first electrode.

Through these techniques, the invention provides a high-speed vertical semiconductor device having an SIT structure. The abnormality occurring at a gate opening portion on the side face of a semiconductor layer of the conventional high-speed vertical structure never occurs in the arrangement of the invention because the invention has no field insulation film. Also, the invention minimizes the length of a p-n junction to suppress parasitic capacitance to a value as small as possible. Since the invention allows the source and drain electrodes of a semiconductor device to be formed with metal or superconducting material, the invention contributes to improve the speed of the semiconductor device.

DESCRIPTION OF THE PREFERRED EMBODIMENTS

Embodiments of a semiconductor device according to the invention will be explained in detail with reference to the drawings.

Figure 3A:
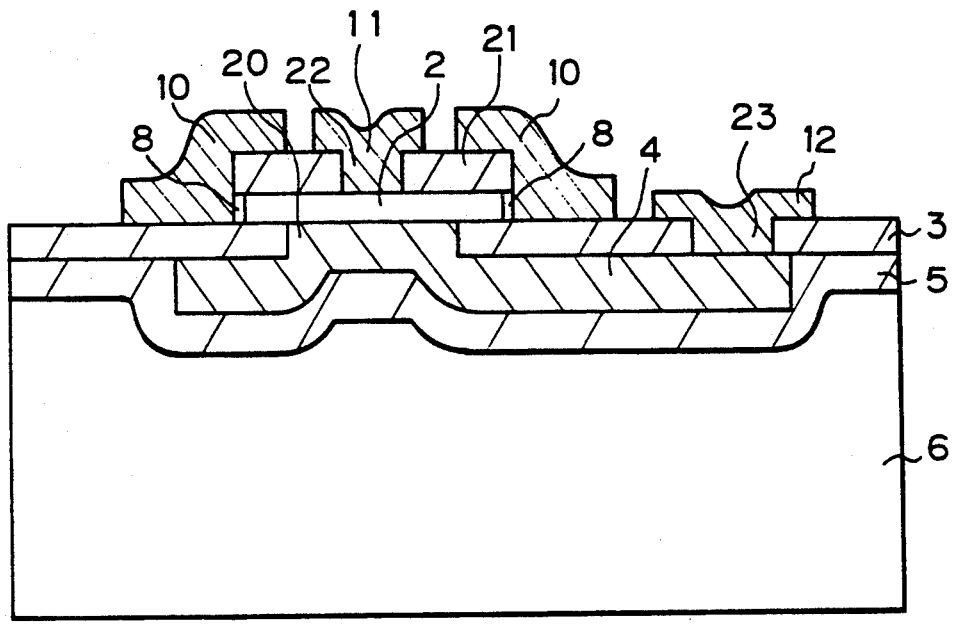
FIGS. 3A and 3B are sectional views showing semiconductor devices according to the invention.

FIG. 3A shows the basic arrangement of a semiconductor device according to the invention. This semiconductor device comprises a first electrode 4 buried in one main face of a substrate 6 and surrounded by a first insulator 5, a field oxide film 3 for covering the surface of the first electrode 4, a semiconductor layer 2 connected with the first electrode 4 through an opening 20 formed on the field oxide film 3, a second insulator 21 covering the surface of the semiconductor layer 2, a second electrode 11 connected with the semiconductor layer 2 through an opening 22 formed on the second insulator 21, a gate electrode 10 connected with the semiconductor layer 2 between the second insulator 21 and the field oxide film 3, and an outgoing electrode 12 connected with the first electrode 4 through another opening 23 formed on the field oxide film 3. This arrangement is applicable for a high-speed vertical MOS transistor, a SIT, or a 3-terminal superconducting transistor.

The substrate 6 is not particularly limited but preferably selected from semiconductor, insulation material, and glass.

One of the features of the invention is that the first electrode 4 buried in the substrate 6 is completely isolated from peripheral devices by the insulator 5. Namely, when the substrate 6 is made of semiconductor, glass, etc., the first electrode 4 is surrounded by the insulator 5 as shown in FIG. 3. If the substrate 6 itself is made of insulation material, the insulator 5 of FIG. 3 is not required.

The first electrode 4 is preferably made of a conductive material having a low resistance and high withstanding voltage. For example, the first electrode 4 is selected among refractory metal, eutectic alloy of metal and semiconductor, such as silicide, superconducting material, and semiconductor material.

In consideration of high integration and efficiency, it is preferable to use a material which allows the first electrode 4 to be fabricated without using a burying technique.

The semiconductor material to be used for the first electrode 4 is preferably polycrystalline silicon having a high heat resistance and high diffusion coefficient to easily diffuse impurities.

The superconducting material to be used for the first electrode 4 may be niobium, or niobium/germanium.

The surface of the first electrode 4 is covered with the field oxide film 3 such as an $SiO_2$ film. The opening 20 is formed through the field oxide film 3, and through which the first electrode 4 is in contact with the semiconductor layer 2.

The semiconductor layer 2 may be made of monocrystalline material, such as monocrystalline silicon, or more preferably, silicon carbide (SiC). It is also possible to make the semiconductor layer 2 from a diamond thin film, or boron nitride monocrystalline material. The semiconductor layer 2 must be chemically stable, serve as a mask, and have a high withstand voltage, as will be explained later in the description of a method of producing a semiconductor device.

The reason why the silicon carbide (SiC) is particularly preferable for the semiconductor layer 2 will be explained.

The band gap (Eg) of SiC is larger than that of Si, so that SiC is advantageous in terms of high-temperature operation. The band gap (Eg) of Si is about 1.1 eV, while that of SiC is about 2.2 eV, which is about two times as large as that of Si.

The maximum operation temperature of an Si device is about 200 degrees centigrade, while an SiC device can operate at least at 400 degrees centigrade. Namely, the SiC device is resistant to severe environment such as high temperature. The breakdown electric field strength (EBD) of Si is about $2 \times 10^5$ V/cm, while that of SiC is about $3 \times 10^6$ V/cm, which is about one digit larger than that of Si. Namely, SiC can form a device having a high withstand voltage.

Figure 9:
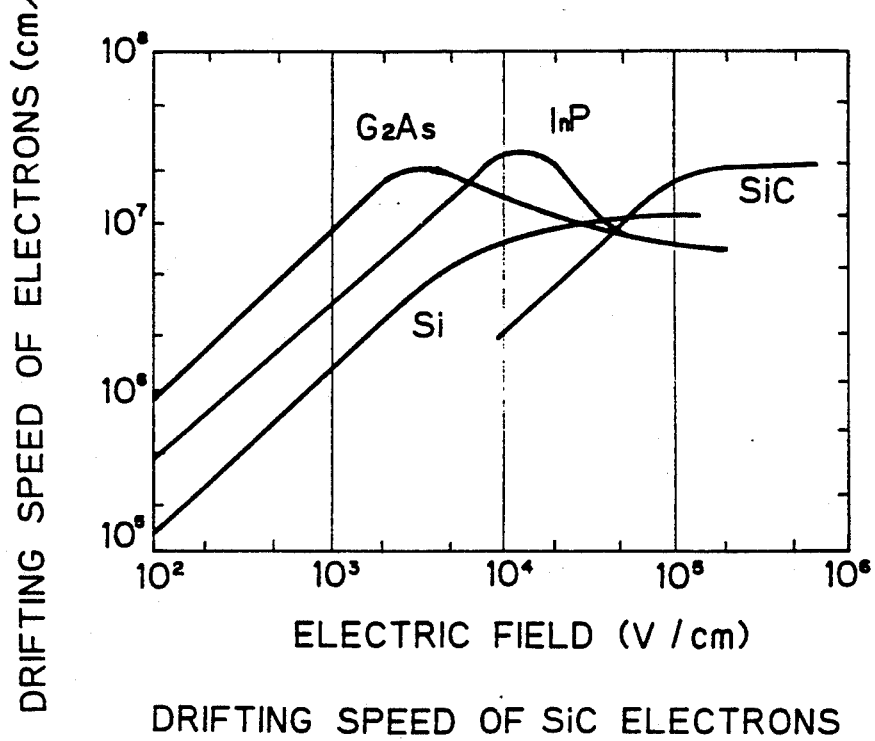
FIG. 9 is a diagram showing electron drifting speeds in silicon carbide (SiC)

As shown in FIG. 9, the electron drifting speed of Si is faster than that of SiC on the low electric field side. On the high electric field side, however, SiC is faster than Si. Generally, in a semiconductor integrated circuit, integrated fine elements do not mean a reduced voltage but an increased internal electric field strength. This is the reason why SiC is more advantageous than Si in improving the operation speed of conventional high-speed devices. In addition, as shown in FIG. 9, SiC is more preferable in the high electric field region than so-called high speed semiconductor materials such as GaAs and InP.

Preferably, the first electrode 4 is made of polycrystalline silicon, and the semiconductor layer 2 of monocrystalline silicon such as SiC.

To improve the operation speed, the semiconductor layer 2 must be as thin as possible.

Figure 3B:
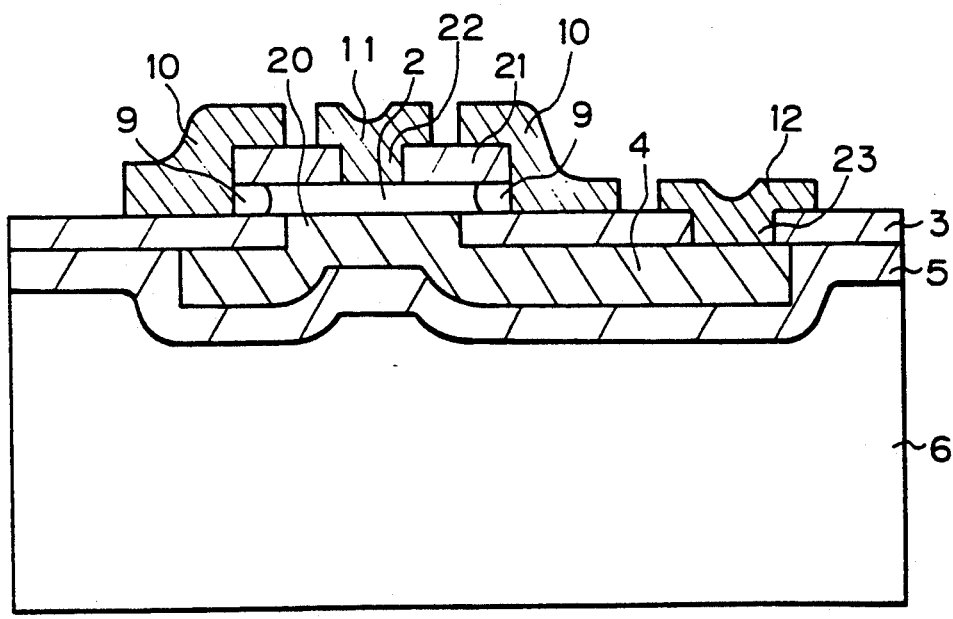

Each end of the semiconductor layer 2 is covered with a gate insulation film 8, and through which the semiconductor layer 2 is connected to the gate electrode 10. Instead of the gate insulation film 8, each end of the semiconductor layer 2 may have a diffusion region 9 in which impurities having a conduction type different from that of the semiconductor layer 2 are diffused, as shown in FIG. 3B. In this case, the semiconductor layer 2 is connected to the gate electrode 10 through the diffusion region 9.

The surface of the semiconductor layer 2 is covered with the second insulator 21 made of an oxide film such as an $SiO_2$ film, or of a nitride film such as $SiN_4$. At a proper position on the second insulator 21, there is formed the opening 22 through which the second electrode 11 is in contact with the semiconductor layer 2.

The second electrode 11 may be made of any material including superconducting material.

In forming the second insulator 21 on the semiconductor layer 2, each end of the semiconductor layer 2 must be exposed between the second insulator 21 and the field insulation film 3 so that the semiconductor layer 2 is in contact with the gate electrode 10.

The opening 23 is formed at a proper but different position from the opening 20 on the field insulation film 3. The output electrode 12 is formed in the opening 23 to be in contact with the first electrode 4.

A method of producing such semiconductor device according to the invention will be explained with reference to FIGS. 8(a) to 8(e).

Figure 8A:
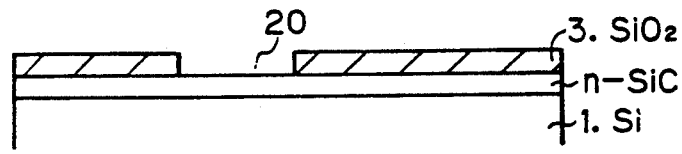
FIGS. 8(a) to 8(e) are views showing a method of producing a semiconductor device according to the invention.

In FIG. 8(a), a temporary Si substrate 1 is used to epitaxially grow thereon an n-type silicon carbide (n-SiC) semiconductor layer 2 of 100 to 1000 angstroms in thickness. The semiconductor layer 2 is selected to have a smaller etching rate than the temporary substrate 1 under certain etching condition.

To epitaxially grow the semiconductor layer 2, there are used $SiCl_3$ as a source gas for Si, $C_3H_8$ as a source gas for C, $B_2H_6$ as a dopant gas, and $H_2$ as a carrier gas. These gases are used in an atmosphere having a reduced pressure of 200 Pa, and at a substrate temperature of 1000 degrees centigrade.

An $SiO_2$ film 3 of 2000 to 3000 angstroms in thickness is grown as the second insulation film 3 on the semiconductor layer 2 according to a vapor deposition (CVD) method, and a contact region 20 is opened according to a normal lithography technique.

Figure 8B:
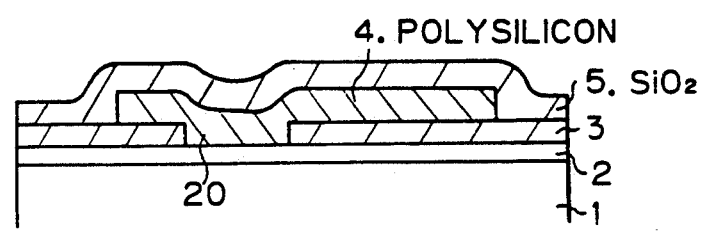

In FIG. 8(b), a doped polysilicon film 4 is grown to a thickness of about 3000 angstroms. Instead of the polysilicon, refractory metals, high-temperature superconducting oxides, etc., may be used as electrode material, as mentioned before.

The polysilicon film 4 is patterned to form the first electrode 4.

An $SiO_2$ film 5 of about 3000 angstroms in thickness is formed over the temporary substrate 1 according to the CVD method. This insulation film 5 is defined as the first insulator 5 according to the invention. This insulation film 5 is not needed if a reinforcing material or a support substrate to be formed later is made of insulation material.

Figure 8C:
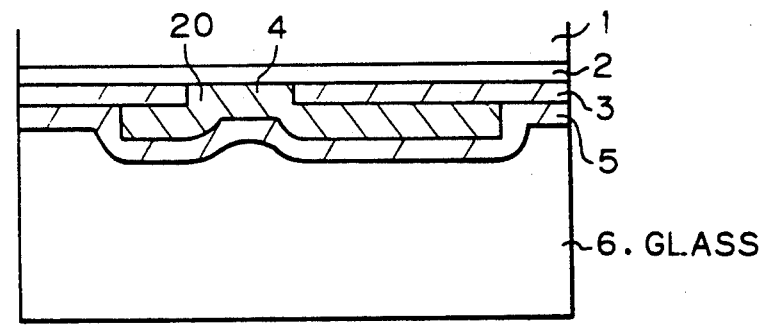

In FIG. 8(c), the structure of FIGS. 8(b) is inverted and a glass plate having a melting point of about 600 to 1000 degrees centigrade is melted and adhered as a reinforcing material 6 to the surface of the first insulating layer 2.

In forming the reinforcing material 6, the surface of the temporary substrate 1 may be flattened with use of a flattening insulation film, etc., and another Si substrate may be adhered as the reinforcing material 6. Alternatively, the reinforcing material 6 may be made of organic material such as resin or inorganic material. In this case, the material to be selected must withstand a heat treatment to be carried out later, or the temperature of the heat treatment must be lowered so that the material may withstand the heat treatment.

The temporary Si substrate 1 is etched with fluoronitrate and removed to expose the semiconductor layer 2. In this case, if the semiconductor layer 2 is made of SiC, it is substantially not etched. Also, the reinforcing material 6 must not be etched. If the reinforcing material 6 is made of glass, it may be masked with organic material such as resist, and after the etching, the organic material is removed.

Thereafter, the semiconductor device as a whole is turned upside down as shown in FIG. 8(c), and the reinforcing material 6 is used as a support substrate in processes that follow.

Through the above processes, the surface of the support substrate 6 becomes completely flat in spite of the buried first electrode 4. This contributes to improve accuracy in the later processes.

Figure 8D:
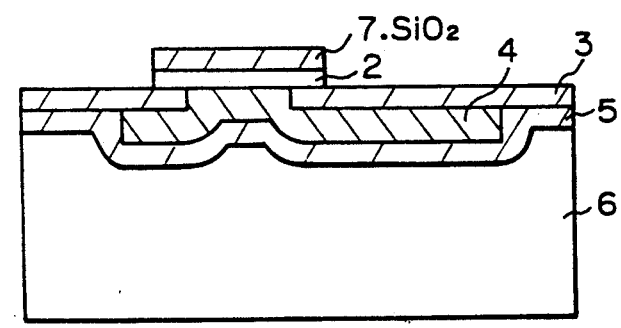

In FIG. 8(d), an $SiO_2$ film 7 (21) of about 2000 angstroms in thickness is formed as the second insulation film 7 (21) on the surface of the support substrate according to a low-temperature plasma CVD method at 400 degrees centigrade. The $SiO_2$ film 7 and SiC layer 2 are etched with use of a resist mask (not shown) formed on a contact region and anisotropic etching, to form a protruding pattern. Each side of the semiconductor layer 2 is opened for a gate electrode. A reactive gas used for this etching is $CF_4$ or $Cl_2 + BCl_3$.

Figure 8E:
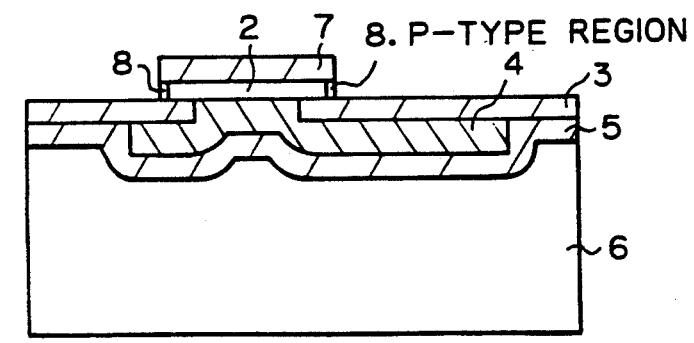

In FIG. 8(e), an $SiO_2$ film 8 of 200 angstroms in thickness is formed on each side wall of the SiC layer 2 according to the CVD method. The film 8 serves as a gate insulation film of a MOS transistor. This gate insulation film may be formed according to a thermal oxidation method or other methods.

In FIG. 3A, openings are formed on the CVD $SiO_2$ film 7 (21) and on the CVD $SiO_2$ film 3 formed on the polysilicon film 4. An aluminum (Al) film is coated over the substrate according to a sputtering method, etc., and patterned into a gate electrode 10, source electrode (the second electrode) 11, and drain electrode (the outgoing electrode for the first electrode) 12. This completes a MOS transistor.

In FIG. 3B, instead of the gate insulation film 8 formed in the process of FIG. 8(e), impurities are diffused to the side wall of the SiC semiconductor layer 2 to change the periphery of the SiC semiconductor layer 2 into a p-type region 9, to thereby form a p-n junction. Here, after the formation of the Al electrodes 10, 11, and 12, the exposed side wall of the SiC semiconductor layer 2 is heat-treated for, for example, 60 minutes at 400 to 500 degrees centigrade so that Al may diffuse into SiO to form the p-type region 9, and thus the p-n junction. SiC forms a good p-n junction due to the diffusion of Al.

In this way, an SIT is produced.

The SOI structure formed through the above processes can solve the problem (1) mentioned before of the conventional semiconductor device.

Since the invention does not use a field insulation film formed by a partial oxidation (LOCOS) method, the invention is free from the problem (2) of the conventional semiconductor device.

The electrode buried in the support substrate may be made of any material including superconducting materials and metals, if it can withstand process temperatures, so that the invention solves the problem (3) of the conventional semiconductor device.

In the above embodiment, a combination of the temporary substrate and semiconductor layer is made of Si and SiC. This may be Si and C (diamond), Si and GaAs, Si and InP, Si and BN, Si and InSb, etc.

Although the embodiment is not a self-align-type element, the invention is also applicable for the self-align-type element such as disclosed in Japanese Unexamined Patent Publication No. 62-309438.

In the embodiment, the first electrode 4 is made of polycrystalline silicon, the second electrode 11 of Al, and the semiconductor layer 2 of SiC. The invention is not limited to these materials, but may be achieved with a proper combination of materials within applicable range thereof. The invention may employ superconducting materials. For example, the second electrode 11 serving as a source electrode and the polysilicon film 4 as a drain electrode may be made of superconducting materials to form a superconducting transistor.

Figure 1:
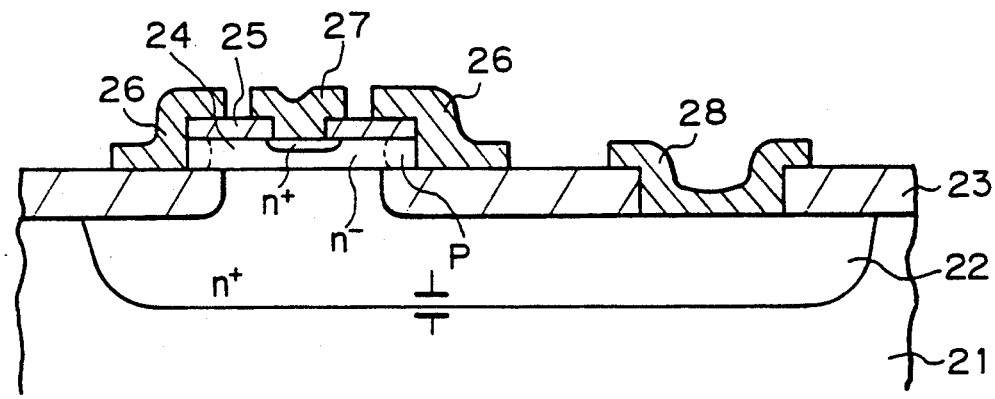
FIG. 1 is a sectional view showing a conventional high-speed transistor.
Figure 2:
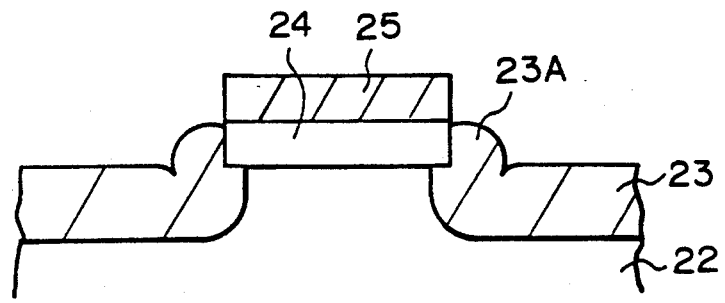
FIG. 2 is a sectional view showing the problem of the conventional semiconductor device after forming a field insulation film.

More precisely, in FIG. 3-1, the first and second electrodes 4 and 11 are made of superconducting materials, and a voltage applied from the gate electrode 10 to the semiconductor layer 2 controls a wave function between the first and second superconducting electrodes, thereby constituting a superconducting transistor.

According to the invention, various types of transistors may be formed by changing the arrangement of the semiconductor layer 2. Namely, any one of the MOSFET, $SiO_2$ FET, junction FET, bipolar transistor may be formed.

Figure 4:
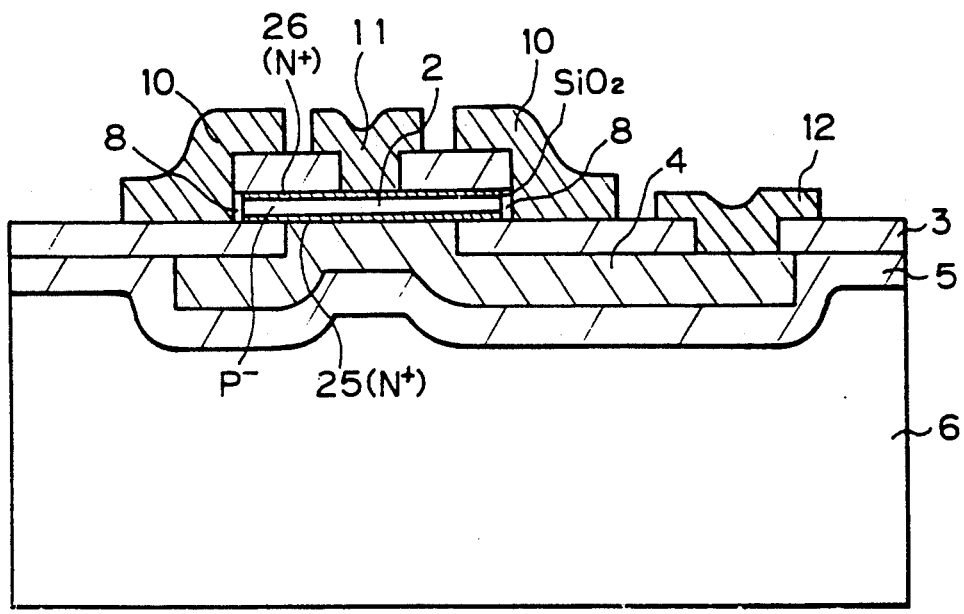
FIGS. 4 to 7 are sectional views showing semiconductor devices according to the invention.

For example, in FIG. 4, the semiconductor layer 2 contains p-type impurities in advance, and n+ impurities are diffused to upper and lower parts of the semiconductor layer 2, thereby forming a MOSFET. In this case, the lower n+ diffusion layer 25 of the semiconductor layer 2 may be formed in the process of FIG. 8(a) by injecting and diffusing the impurities, and the upper n+ diffusion layer 26 may be formed in the process of FIG. 8(c) by injecting and diffusing the impurities. It is possible to oppositely use the n-type and p-type impurities. The n+ diffusion layers are preferably formed in contact with the $SiO_2$ insulation film 8 formed on each side of the semiconductor layer 2.

Figure 5:
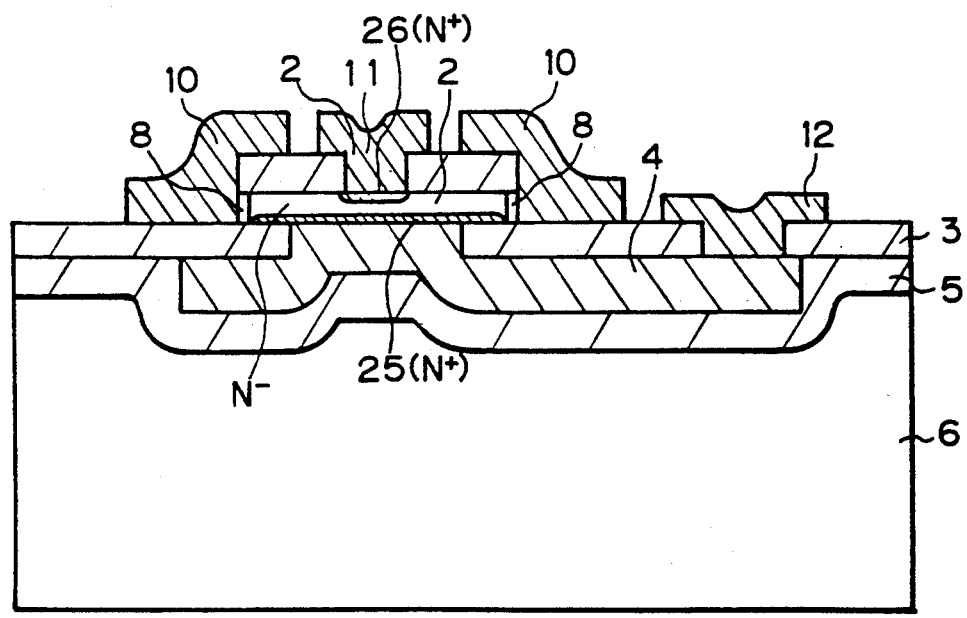

FIG. 5 shows an $SiO_2$ FET formed at the semiconductor layer 2 according to the invention. In this example, the semiconductor layer 2 has n− conductivity. A lower region 25 of the semiconductor layer 2 is made by diffusing n+ impurities, and an upper region 26 corresponding to the opening 22 is made by diffusing n+ impurities. The lower diffusion region 25 is made in the process of FIG. 8(a) by diffusing the n-type impurities, while the upper diffusion region 26 is made after the process of FIG. 8(e) by diffusing the n-type impurities through the opening 22. In this example also, p-type semiconductor instead of the n-type semiconductor may be used.

Figure 6:
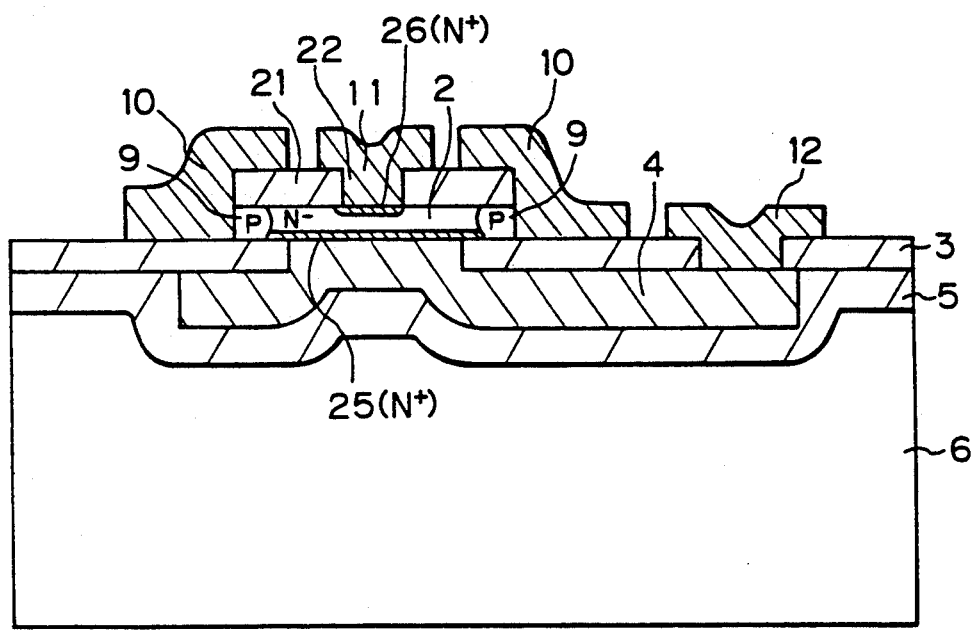

FIG. 6 shows a junction FET formed at the semiconductor layer 2 according to the invention. In the figure, the semiconductor layer 2 is of n− semiconductor each end of which has a p-type diffusion layer 9. An n+ diffusion region 25 is formed under the lower side of the semiconductor layer 2, and an n+ diffusion layer 26 is formed at the center of the upper side of the semiconductor layer 2. These regions 25 and 26 are formed in substantially the same manner as the example of FIG. 5. The conduction types of FIG. 6 are reversible.

Figure 7:
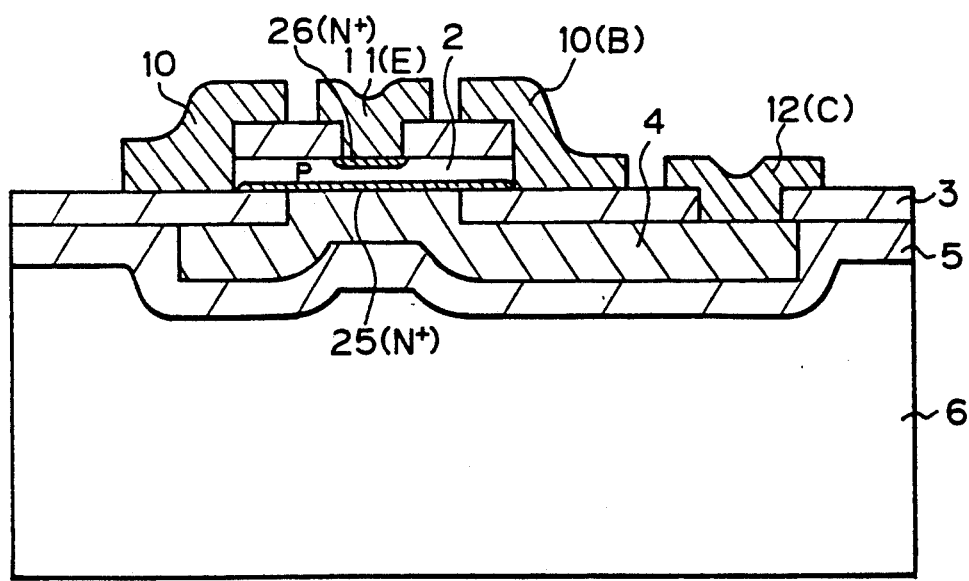

FIG. 7 shows a bipolar transistor formed at the semiconductor layer 2 according to the invention. In this case, the semiconductor layer 2 is of, for example, p-type semiconductor. An n+ diffusion region 25 is formed under the lower side of the semiconductor layer 2, and an n+ diffusion region 26 is formed at the center of the upper side of the semiconductor layer 2. The electrode 11 serves as an emitter (E), the electrode 10 as a base (B), and the electrode 12 as a collector (C). The diffusion regions 25 and 26 are formed in the same manner as in FIGS. 5 and 6. The conduction types of FIG. 7 are reversible.

According to the invention, the p-type impurities may be Al, B, etc., and the n-type impurities As, P, Sb, N, etc.

Figure 10:
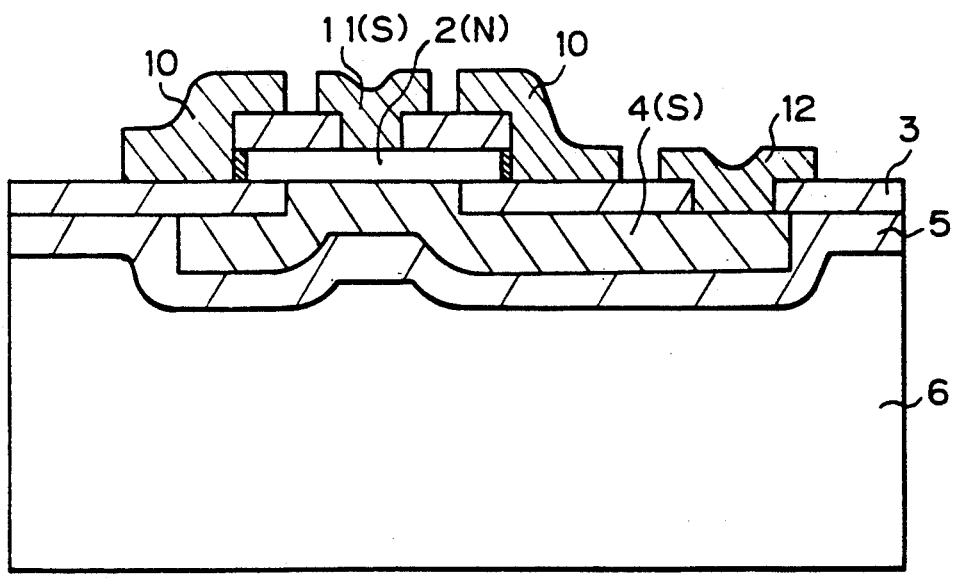
FIG. 10 is a sectional view showing another semiconductor device according to the invention.

FIG. 10 shows a 3-terminal element involving a super conducting transistor according to the invention. In the figure, a first electrode 4 is made of superconducting material, a second electrode 11 also of superconducting material, and semiconductor layer 2 is of normal semiconductor material. Namely, the monocrystalline semiconductor layer 2 is held between the superconducting materials 11(S) and 4(S). The conduction type of the semiconductor layer 2 is optional. Each end of the semiconductor layer 2 is preferably covered with an insulation film. In this super conducting transistor, the phase of an electron wave function can be shifted by changing a voltage applied to a gate electrode 10 that is in contact with the semiconductor layer 2, to thereby control a current. If the semiconductor layer 2 is thinned, the wave function is more influenced.

Another method of producing such a semiconductor device according to the invention having the first electrode made of a metal having a high melting point, high-temperature superconducting oxides, ceramics, a eutectic alloy of metal and semiconductor or silicides, instead of the polycrystalline silicon, will be explained hereunder.

First, a method of producing a semiconductor device having the first electrode made of a silicide, for example, $W_2Si_3$, a metal having a high melting point, for example, tungsten W or a composite material comprising polycrystalline silicon and silicide such as $W_2Si_3$, will be explained with reference to FIG. 11.

Figure 11A:
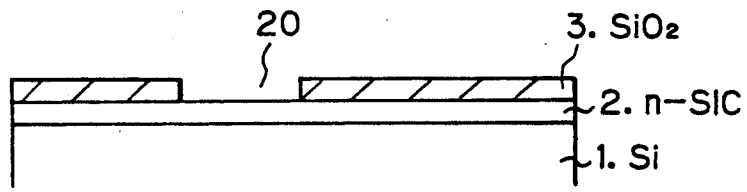
FIGS. 11(A) to 11(G) are views showing another method of producing a semiconductor device according to the invention.

In FIG. 11(A), a temporary Si substrate 1 is used to epitaxially grow thereon an n-type silicon carbide (n-SiC) semiconductor layer 2 100 to 1000 angstroms in thickness. The conditions for an epitaxial growth thereof are substantially the same as shown in the previous embodiment illustrated in FIGS. 8(a) to 8(e).

An $SiO_2$ film 3 2000 to 3000 angstroms in thickness is grown as the second insulation film 3 on the semiconductor layer 2 by a vapor deposition (CVD) method, and a contact region 20 is opened by a normal lithography technique.

Figure 11B:
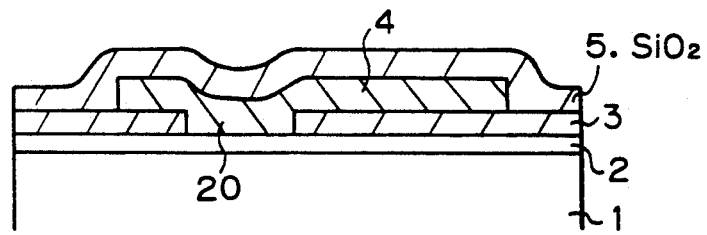

In FIG. 11(B), a film 41 made of the silicide ($W_2Si_3$), a metal having a high melting point such as tungsten W, or a composite material comprising polycrystalline silicon and silicide such as $W_2Si_3$, is formed to a thickness of about 3000 angstroms.

When the composite material comprising polycrystalline silicon and silicide such as $W_2Si_3$ is used, polycrystalline silicon doped with phosphorus is preferably used to thereby prevent a contamination of the semiconductor device in accordance with the present invention with metal.

Next, the film 41 thus formed is patterned to form the first electrode 4.

Then, an $SiO_2$ film 5 about 3000 angstroms in thickness is formed over the temporary substrate 1 by the CVD method.

This insulation film 5 is defined as the first insulator 5 according to the invention.

Figure 11C:
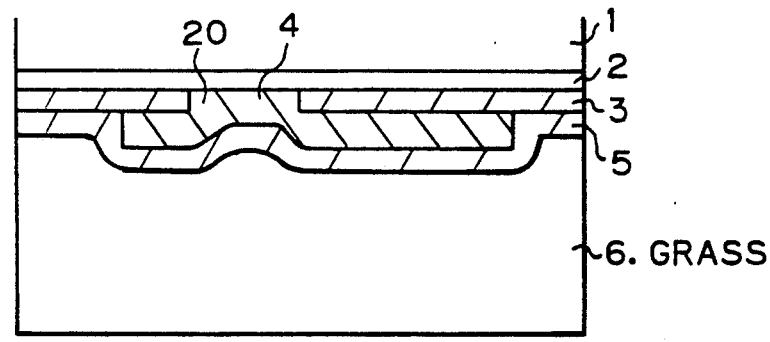

In FIG. 11(C) a glass plate having a melting point of about 600 to 1000 degrees centigrade is used as a reinforcing material 6, and is melted and adhered to a surface of the $SiO_2$ film 5 made by the CVD method.

When forming the reinforcing material 6, the method of forming the same as shown in FIGS. 8(a) to 8(e) is applicable to this embodiment.

The temporary Si substrate 1 is etched with fluoronitrate and removed to expose the semiconductor layer 2. In this case, if the semiconductor layer 2 is made of SiC, it is substantially not etched.

Thereafter, the semiconductor device as a whole is turned upside down, as shown in FIG. 11(C), and the reinforcing material 6 is used as a support substrate.

Figure 11D:
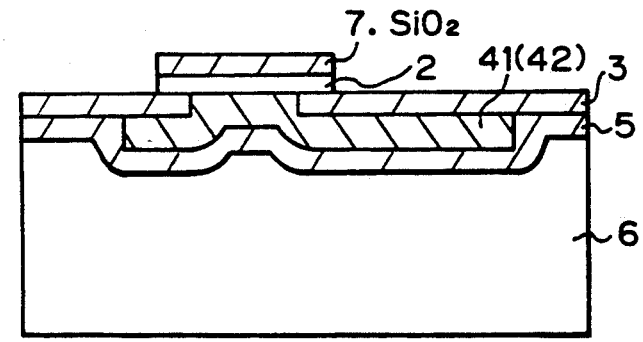

In FIG. 11(D), an SiO$_2$ film 7 about 2000 angstroms in thickness is formed as the second insulation film 7 (21) on the surface of the support substrate, by a low-temperature plasma CVD method at 400 degrees centigrade.

The SiO$_2$ film 7 and SiC layer 2 are etched while using a resist mask (not shown) formed on a contact region, and an anisotropic etching, to form a protruding pattern.

Each side of the semiconductor layer 2 is opened for a gate electrode.

Figure 11E:
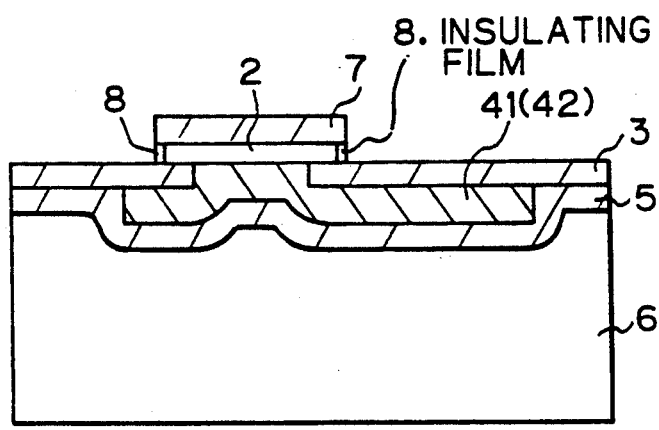

In the embodiment of the present invention, when a gate electrode is formed with an insulating film, as shown in FIG. 11(E), an SiO$_2$ film 8 300 angstroms in thickness is formed on each side wall of the SiC layer 2 by the CVD method.

The process of forming the insulating gate film 8 is such that the semiconductor layer made of SIC is subjected to a thermal treatment at a temperature of 1000° C. for 30 minutes under a wet atmosphere, whereby the oxide film having a thickness of 300 angstroms is formed on the side wall of the SIC semiconductor layer 2, or after forming a SiO$_2$ film about 300 angstroms in thickness on a whole surface of the semiconductor device by the CVD method, the SiO$_2$ film is removed while leaving necessary portions thereof at the required areas.

Figure 11F:
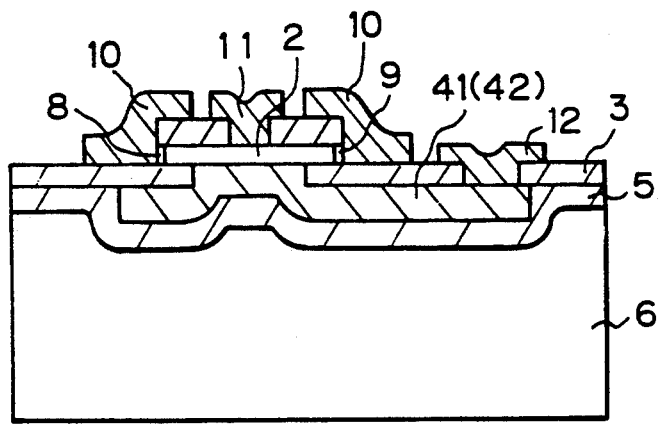

In FIG. 11(F), openings are formed on the CVD SiO$_2$ film 7 and on the CVD SiO$_2$ film 3 formed on the film 41, which will be the first electrode.

An aluminum (Al) film is coated over the substrate by a sputtering method, etc., and patterned to form a gate electrode 10, source electrode (the second electrode) 11, and drain electrode (the outgoing electrode for the first electrode) 12. Note, in this embodiment, these electrodes can be made of any kind of metal having a sufficient conductivity.

On the other hand, when the gate of the semiconductor device of this embodiment is formed by a P-N conjunction instead of the insulating film, in the process shown in FIG. 11(D), an aluminum (Al) film is first formed on an overall surface of the semiconductor device, and then the film is subjected to a thermal treatment at 500° C. for about 60 minutes.

Then, after the film is subjected to a treatment with HCl to thereby remove the film therefrom, it is further subjected to an annealing treatment at about 900° C. for about 30 minutes.

Accordingly, a P-type diffusing layer obtained by a diffusion of aluminum (Al) into the SIC layer is formed at both end portions of the SiC semiconductor layer 2, which are exposed to the air, and thus a good P-N junction is formed therein.

Figure 11G:
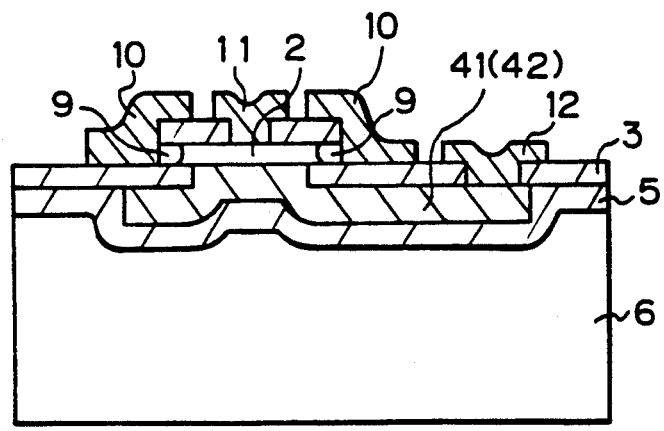

The same treatment for forming electrodes as shown in the previous embodiment is then carried out, and a semiconductor device as shown in FIG. 11(G) obtained.

Next, another method of producing a semiconductor device according to the invention having the first electrode made of high-temperature superconducting oxides, for example, YBa$_2$Cu$_3$O$_{7-x}$ or Bi$_2$Sr$_2$CaCu$_2$O$_y$, will be explained with reference to FIG. 12.

Figure 12A:
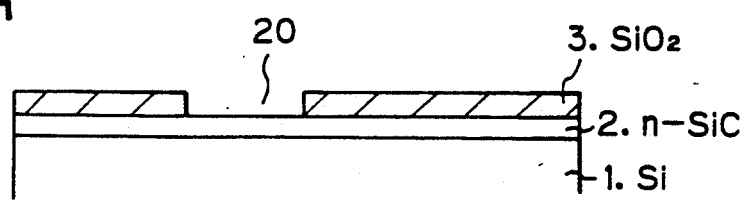
FIGS. 12A-12C are views showing a further method of producing a semiconductor device according to the invention.

The process as shown FIG. 12(a) is carried out in the same way as shown in FIG. 11(A).

Figure 12B:
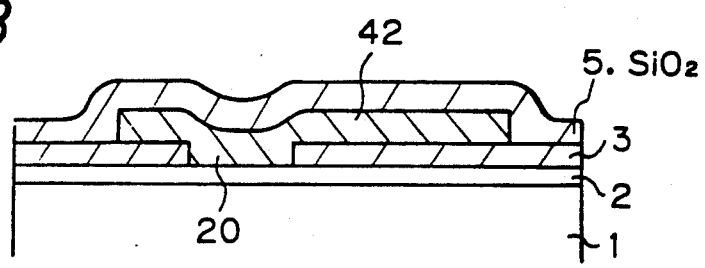
Figure 12C:
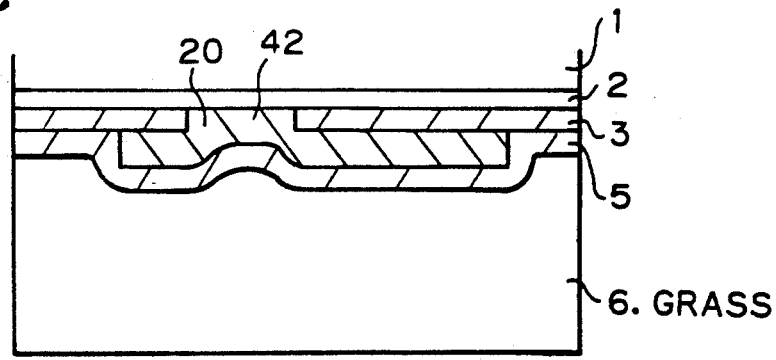

In the process shown in FIG. 12(b), a first electrode 4 is formed of a film 42 made of high-temperature superconducting oxides, for example, YBa$_2$Cu$_3$O$_{7-x}$ or Bi$_2$Sr$_2$CaCu$_2$O$_y$, instead of a film 41 made of the silicide (W$_2$Si$_3$), a metal having a high melting point such as tungsten W or a composite material comprising polycrystalline silicon and silicide such as W$_2$Si$_3$, as shown in FIG. 11(B)

A sputtering method or MBE method can be used for forming the film 42 of this embodiment.

Thereafter, the same processes as shown in FIGS. 11(C) to 11(G) can be applied to this embodiment, but preferably an etching method utilizing Ar$^+$ ion beam is used in this embodiment.

In this embodiment, the electrodes 10, 11 and 12, as shown in FIGS. 11(F) and 11(G), are preferably made of high-temperature superconducting oxides.

As explained above, the high-speed vertical semiconductor device and the method of producing the same according to the invention provide the following benefits;

(1) forming an SOI structure suitable for a high-speed operation;

(2) eliminating a field insulation film, and thereby eliminating an abnormality frequently occurring, due to the field insulation film, at a gate opening portion adjacent to a semiconductor layer in conventional high-speed vertical structures;

(3) allowing the source and drain electrodes of a semiconductor device to be formed with superconducting materials, thereby improving the speed of the semiconductor device; and (4) precisely and efficiently producing semiconductor devices with use of a self-alignment technique without using a LOCOS technique.

I claim:

1. A method of producing a semiconductor device comprising:

a first process of forming, on a temporary substrate, a semiconductor layer of a first conduction type and having a smaller etching rate than that of the temporary substrate under the same etching condition, forming a first insulation film on the semiconductor layer, and opening a contact hole in and extending through the first insulation film to expose the semiconductor layer;

a second process of forming a first electrode on the first insulation film and over the contact hole therein, such that the first electrode connects through the contact hole in the first insulation film with the semiconductor layer;

a third process of indirectly adhering a reinforcing material through an insulator, or directly adhering a reinforcing insulation material, onto the structures formed by the first and second processes on the temporary substrate and etching and removing the temporary substrate utilizing the semiconductor layer as an etching stopper, the reinforcing material thereupon being employed as a support substrate;

a fourth process of forming a second insulation film on the semiconductor layer and patterning same thereby to form a protruding pattern of the semiconductor layer and the second insulation film, laminated one upon another, on the support substrate, the protruding pattern of the semiconductor layer and the second insulation film protruding from the support substrate and defining at least one protruding and exposed side face of the semiconductor layer; and a fifth process of forming a gate electrode on each exposed side face of the semiconductor layer and in non-electrically conducting relationship with the exposed side face, opening a contact hole in the second insulation film thereby to expose the semiconductor layer, forming a second electrode on the second insulation film and over the contact hole therein such that the second electrode connects through the contact hole in the second insulation film with the semiconductor layer, opening a contact hole in the first insulation film, and forming an output electrode on the first insulation film and over the contact hole therein such that the output electrode connects through the contact hole in the first insulation film with the first electrode and thereby with the semiconductor layer.

2. A method as set forth in claim 1, wherein the fourth process further comprises forming a region on each exposed side face of the semiconductor layer having a conduction type opposite to that of the semiconductor layer.

3. A method as set forth in claim 1, wherein the first and second electrodes are made of superconducting material.

4. A method as set forth in claim 1, wherein the support substrate is made of one of semiconductor, insulation material, and glass materials.

5. A method as set forth in claim 1, wherein the first electrode is made of one of metal, a eutectic alloy of metal and semiconductor, superconducting, and semiconductor materials.

6. A method as set forth in claim 1, wherein the semiconductor material is polycrystalline silicon.

7. A method as set forth in claim 1, wherein the semiconductor layer is made of monocrystalline material.

8. A method as set forth in claim 7, wherein the monocrystalline material is monocrystalline silicon.

9. A method as set forth in claim 7, wherein the monocrystalline silicon material is silicon carbide (SiC).

10. A method of producing a semiconductor device comprising:

a first process of forming, on a temporary substrate, a semiconductor layer of a first conduction type and having a smaller etching rate than that of the temporary substrate under the same etching condition, forming a first insulation film on the semiconductor layer, and opening a contact hole in and extending through the first insulation film to expose the semiconductor layer;

a second process of forming a first electrode on the first insulation film and over the contact hole therein, such that the first electrode connects through the contact hole in the first insulation film with the semiconductor layer;

a third process of indirectly adhering a reinforcing material through an insulator, or directly adhering a reinforcing insulation material, onto the structures formed by the first and second processes on the temporary substrate and etching and removing the temporary substrate utilizing the semiconductor layer as an etching stopper, the reinforcing material thereupon being employed as a support substrate;

a fourth process of forming a second insulation film on the semiconductor layer and patterning same thereby to form a protruding pattern of the semiconductor layer and the second insulation film, laminated one upon another, on the support substrate, the protruding pattern of the semiconductor layer and the second insulation film protruding form the support substrate and defining at least one protruding and exposed side face of the semiconductor layer, and forming a gate insulation film on each exposed side face of the semiconductor layer; and a fifth process of forming a gate electrode on at least the gate insulation film formed each exposed side face of the semiconductor layer, opening a contact hole in the second insulation film thereby to expose the semiconductor and forming a second electrode on the second insulation film and over the contact hole in the second insulation film with the semiconductor layer, opening a contact hole in the first insulation film, and forming an output electrode on the first insulation film and over the contact hole therein such that the output electrode connects through the contact hole in the first insulation film with the first electrode and thereby with the semiconductor layer.

11. A method of producing a semiconductor device comprising:

a first process of forming, on a temporary substrate, a semiconductor layer of a first conduction type and having smaller etching rate than that of the temporary substrate under the same etching condition, forming a first insulation film on the semiconductor layer, and opening a contact hole in and extending through the first insulation film to expose the semiconductor layer;

a second process of forming a first electrode on the first insulation film and over the contact hole therein, such that the first electrode connects through the contact hole in the first insulation film with the semiconductor layer;

a third process of indirectly adhering a reinforcing material through an insulator, or directly adhering a reinforcing insulation material, onto the structures formed by the first and second processes on the temporary substrate and etching and removing the temporary substrate utilizing the semiconductor layer as an etching stopper, the reinforcing material thereupon being employed as a support substrate;

a fourth process of forming a second insulation film on the semiconductor layer and patterning same thereby to form a protruding pattern of the semiconductor layer and the second insulation film, laminated one upon another, on the support substrate, the protruding pattern of the semiconductor layer and the second insulation film protruding from the support substrate and defining at least one protruding and exposed side face of the semiconductor layer, and forming a diffusion region on each exposed side face of the semiconductor layer; and a fifth process of forming a gate electrode on at least the diffusion region formed on each exposed side face of the semiconductor layer, of opening a contact hole in the second insulation film thereby to expose the semiconductor layer, and forming a second electrode on the second insulation film and over the contact hole therein such that the second electrode connects through the contact hole in the second insulation film with the semiconductor layer, opening a contact hole in the first insulation film, and forming an output electrode on the first insulation film and over the contact hole therein such that the output electrode connects through the contact hole in the first insulation film with the first electrode and thereby with the semiconductor layer.

12. A method as set forth in claim 2, wherein the first and second electrodes are made of superconducting material.

* * * * *

UNITED STATES PATENT AND TRADEMARK OFFICE
CERTIFICATE OF CORRECTION

PATENT NO. : 5,202,273
DATED : April 13, 1993
INVENTOR(S) : Shunji NAKAMURA

It is certified that error appears in the above-indentified patent and that said Letters Patent is hereby corrected as shown below:

Col. 12, line 14, after "formed" insert --on--;
line 19, after "hole" insert --therein such that the second electrode connects through the contact hole--;
line 31, after "having" insert --a--.

Signed and Sealed this

Thirty-first Day of May, 1994

Attest:

BRUCE LEHMAN

Attesting Officer

Commissioner of Patents and Trademarks